(12) United States Patent
Cabral, Jr. et al.

(10) Patent No.: US 6,700,203 B1
(45) Date of Patent: Mar. 2, 2004

(54) SEMICONDUCTOR STRUCTURE HAVING IN-SITU FORMED UNIT RESISTORS

(75) Inventors: Cyril Cabral, Jr., Ossining, NY (US); Lawrence Clevenger, LaGrangeville, NY (US); Louis Lu-Chen Hsu, Fishkill, NY (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 230 days.

(21) Appl. No.: 09/686,742

(22) Filed: Oct. 11, 2000

(51) Int. Cl.$^7$ ............................................... H01L 23/48
(52) U.S. Cl. ....................................... 257/774; 257/758
(58) Field of Search ................................ 257/758, 761, 257/764, 768, 770, 774, 776; 438/637

(56) References Cited

U.S. PATENT DOCUMENTS 6,246,120 B1 * 6/2001 Brennan et al. ............ 257/774
6,274,899 B1 * 8/2001 Melnick et al. ............. 257/298
6,359,328 B1 * 3/2002 Dubin ......................... 257/622
6,404,058 B1 * 6/2002 Taguwa ....................... 257/770

* cited by examiner

Primary Examiner—John B. Vigushin
Assistant Examiner—Lourdes Cruz
(74) Attorney, Agent, or Firm—Robert M. Trepp; Randy W. Tung

(57) ABSTRACT

An electronic structure that has in-situ formed unit resistors and a method for fabricating such structure are disclosed. The electronic structure that has in-situ formed unit resistors consists of a first plurality of conductive elements formed in an insulating material layer, a plurality of electrically resistive vias formed on top and in electrical communication with at least one of the first plurality of conductive elements, and a second plurality of conductive elements formed on top of and in electrical communication with at least one of the plurality of electrically resistive vias. The present invention novel structure may further be formed in a multi-level configuration such that multi-level resistors may be connected in-series to provide larger resistance values. The present invention novel structure may further be combined with a capacitor network to form desirable RC circuits.

15 Claims, 5 Drawing Sheets

SEMICONDUCTOR STRUCTURE HAVING IN-SITU FORMED UNIT RESISTORS

FIELD OF THE INVENTION

The present invention generally relates to an electronic structure that has in-situ formed unit resistors and a method for fabrication such structure and more particularly, relates to a semiconductor structure that has in-situ formed unit resistors fabricated of a refractory metal alloy having a resistivity of at least 100 Ω-cm and a method for fabricating the structure.

BACKGROUND OF THE INVENTION

In conventional electronic devices, resistors are electrically connected to a circuit board to provide specific electrical resistances to an electronic circuit.

In semiconductor devices, it has been difficult to provide resistors inside a semiconductor structure. Particularly, it has not been possible to form by an in-situ method resistors in a semiconductor structure that provide high resistance in the range of more than several thousand Ω/square. The only resistor designed for use in a semiconductor device has been a diffusion resistor which is built on the surface of a semiconductor substrate. The resistivity of a diffusion resistor is in the range between about 100 Ω/square and about 4,000 Ω/square. To date, it has not been possible to build unit resistors inside a semiconductor structure, and particularly, to built unit resistors in a vertical direction of the structure. One reason for such difficulty is the unavailability of a material that can be used in a semiconductor fabrication process that has sufficiently high electrical resistivity.

It is therefore an object of the present invention to provide an electronic structure that has in-situ formed unit resistors therein that does not have the drawbacks or shortcomings of the conventional diffusion resistors.

It is another object of the present invention to provide an electronic structure that has in-situ formed unit resistors therein by using a high resistivity refractory metal alloy.

It is a further object of the present invention to provide an electronic structure that has in-situ formed unit resistors therein that are situated in a vertical direction of the structure.

It is still another object of the present invention to provide an electronic structure that has in-situ formed unit resistors therein that are formed of electrically resistive vias.

It is another further object of the present invention to provide an electronic structure that has in-situ formed electrically resistive vias therein wherein the vias are formed of a material having a resistivity of at least 100 Ω-cm.

It is yet another object of the present invention to provide an electronic structure that has in-situ formed unit resistors which are formed of a refractory metal-silicon-nitrogen material.

It is still another further object of the present invention to provide a method for forming a semiconductor structure that has in-situ formed unit resistors therein by first forming a plurality of conductive elements, then a plurality of electrically resistive vias in electrical communication with the plurality of conductive elements, and then a plurality of conductive elements in electrical communication and on top of the plurality of electrically resistive vias.

It is yet another further object of the present invention to provide an electronic structure that has an in-situ formed unit resistor in electrical communication with a capacitor which includes a unit resistor formed of a high resistivity refractory metal alloy juxtaposed to and in electrical communication with the capacitor.

SUMMARY OF THE INVENTION

In accordance with the present invention, an electronic structure that has in-situ formed unit resistors and a method for fabricating such structure are provided. The invention further provides an electronic structure that has in-situ formed unit resistors juxtaposed to and in electrical communication with a capacitor.

In a preferred embodiment, an electronic structure that has in-situ formed unit resistors is provided which includes a pre-processed substrate which has a first insulating material layer on top; a first plurality of conductive elements formed on the first insulating material layer; a second insulating material layer overlying the first plurality of conductive elements and the first insulating material layer; a plurality of electrically resistive vias that has a resistivity of at least 100 Ω-cm formed, in the second insulating material layer wherein each of the first plurality of conductive elements in electrical communication with at least one of the plurality of electrically resistive vias; and a second plurality of conductive elements formed on top of the second insulating material layer each in electrical communication with at least one of the plurality of electrically resistive vias.

In the electronic structure that has in-situ formed unit resistors, the pre-processed substrate may be a semiconductor wafer that has a first dielectric material layer formed on top, the pre-processed substrate may be formed of an electrically insulating material selected from the group consisting of glass, ceramic and polymeric materials. The plurality of electrically resistive vias may be formed of a refractory metal-silicon-nitrogen material, or may be formed of a refractory metal-silicon-nitrogen material wherein the refractory metal is selected from Ta, Nb, V, W or Ti. The plurality of electrically resistive vias may be formed of TaSiN which has a composition of between about 10 at. % and about 55 at. % Ta, between about 10 at. % and about 45 at. % Si, and between about 30 at. % and about 80 at. % N. The plurality of electrically resistive vias each has a diameter between about 0.1 μm and about 100 μm, and a height between about 10 nm and about 1,000 nm. The plurality of electrically resistive vias may have a resistivity preferably of at least 150 Ω-cm.

The plurality of electrically resistive vias may be formed by depositing a TaSiN film layer into a plurality of via openings, wherein the TaSiN film layer may have a sheet resistance between about 0.3 M-Ω/square and about 1 K-Ω/square. The plurality of electrically resistive vias may further have a diameter preferably of about 1 μm and a height preferably of about 100 nm. The first plurality of conductive elements and the second plurality of conductive elements may be formed of a material selected from the group consisting of doped polysilicon, metal silicide, polycide, refractory metals, aluminum, copper and alloys thereof. Each of the first plurality of conductive elements may be in electrical communication with two of the plurality of electrically resistive vias that are immediately adjacent to each other. Each of the second plurality of conductive elements may be in electrical communication with two of the plurality of electrically resistive vias that are immediately adjacent to each other.

The electronic structure that has in-situ formed unit resistors of the present invention may further include a third insulating material overlying the second plurality of conductive elements and the second insulating material layer; a second plurality of electrically resistive vias that has a resistivity of at least 100 Ω-cm formed in the third insulating material layer wherein each of the second plurality of conductive elements in electrical communication with at least one of the second plurality of electrically resistive vias; and a third plurality of conductive elements formed on top of the third insulating material layer each in electrical communication with at least one of the second plurality of electrically resistive vias, whereas at least one of the second plurality of electrically resistive vias is in electrical communication with at least one of said first plurality of electrically resistive vias.

The present invention is further directed to a method for forming a semiconductor structure with in-situ unit resistors by the operating steps of first providing a pre-processed substrate that has a planar top surface; depositing a first insulating material layer on the planar top surface of the pre-processed substrate; forming a first plurality of conductive elements on the first insulating material layer; depositing a second insulating material layer on top of the first plurality of conductive elements and the first insulating material layer; forming a plurality of via openings in the second insulating material layer, each of the via openings exposing one of the first plurality of conductive elements; depositing an electrically resistive metal that has a resistivity of at least 100 Ω-cm into the plurality of via openings forming a plurality of electrically resistive vias; and forming a second plurality of conductive elements on top of the second insulating material layer wherein each of the second plurality of conductive elements in electrical communication with at least one of the plurality of electrically resistive vias.

The method for forming a semiconductor substrate with in-situ unit resistors may further include the step of depositing the electrically resistive metal in TaSiN, or the step of depositing the electrically resistive metal by sputtering a Ta—Si alloy target in the presence of nitrogen, or the step of depositing the electrically resistive metal by co-sputtering from Ta and Si targets in the presence of nitrogen. The method may further include the step of depositing the electrically resistive metal by co-depositing from a Ta target at a sputtering power of at least 50 W dc and a Si target at a sputtering power of at least 300 W rf. The method may further include the step of depositing the electrically resistive metal by evaporation or chemical vapor deposition. The method may further include the step of patterning a layer of the electrically resistive metal by reactive ion etching utilizing a photoresist mask, or the step of conducting the RIE by using a gas of $Cl_2/O_2$ or $Cl_2$. The method may further include the step of forming the plurality of via openings each having a height between about 10 nm and about 1,000 nm, a diameter between about 0.1 µm and about 100 µm. The method may further include the step of removing excess electrically resistive material from a top surface of the second insulating material layer by chemical mechanical polishing.

The present invention is still further directed to an electronic structure that has an in-situ formed unit resistor in electrical communication with a capacitor which includes a unit resistor that is formed by a first conductive element and a second conductive element situated in different levels in the electronic structure connected therein between by an electrically resistive via, the electrically resistive via may be formed of a material that has a resistivity of at least 100 Ω-cm; and a capacitor formed juxtaposed to and in electrical communication with the unit resistor.

In the electronic structure that has an in-situ formed unit resistor in electrical communication with a capacitor, the capacitor may be a deep-trench capacitor or a stacked capacitor. The unit resistor may be electrically connected in-series with the capacitor, or electrically connected in-parallel with the capacitor. The unit resistor may be electrically connected to and situated on top of the capacitor, or electrically connected to and situated below the capacitor. The electrically resistive via may be formed of a refractory metal-silicon-nitrogen material wherein the refractory metal may be selected from the group consisting of Ta, Nb, V, W and Ti. The electrically resistive via may be formed of a diameter between about 0.1 µm and about 100 µm, and at a height between about 10 nm and about 1,000 nm.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATE EMBODIMENTS

Figure 1A:
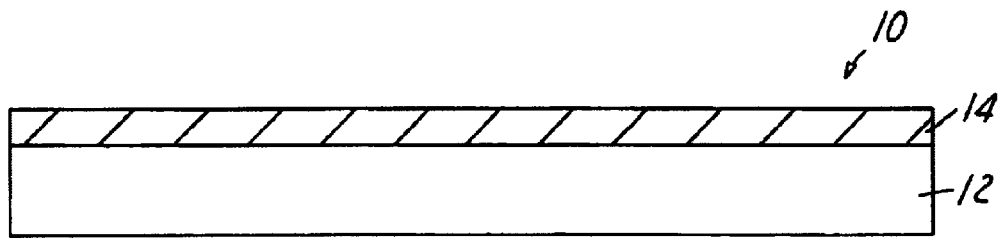
FIG. 1A is an enlarged, cross-sectional view of the present invention electronic structure showing a first conductive material layer deposited on a first insulating material layer.

The present invention discloses an electronic structure or a semiconductor structure that has in-situ formed unit resistors, or in-situ formed unit resistors immediately adjacent to a capacitor network wherein the capacitor network may be a deep-trench capacitor or a stacked capacitor.

The electronic structure that has in-situ formed unit resistors is constructed by a first plurality of conductive elements formed in a first insulating material layer or in an insulating substrate, a plurality of electrically resistive vias formed on top of and in electrical communication with the first plurality of conductive elements, and a second plurality of conductive elements formed on top of and in electrical communication with at least one of the electrically resistive vias. The first plurality of conductive elements and the second plurality of conductive elements are embedded in and insulated by a dielectric material layer, while the plurality of electrically resistive vias are formed in via openings in an insulating material layer wherein the via openings have a thickness between about 10 nm and about 1,000 nm, and a diameter between about 0.1 $\mu$m and about 100 $\mu$m.

The plurality of electrically resistive vias are formed of an electrically conductive material that has a resistivity of at least 100 $\Omega$-cm, and preferably at least 150 $\Omega$-cm. A suitable electrically resistive material for filling the via openings is a refractory metal alloy, such as one that is refractory metal-silicon-nitride. The refractory metal in the alloy may be suitably Ta, Nb, V, W or Ti.

In a typical refractory metal-silicon-nitrogen composition such as TaSiN, the Ta content is between about 10 at. % and about 55 at. %, the Si content is between about 10 at. % and about 45 at. %, and the N content is between about 30 at. % and about 80 at. %. In a preferred embodiment, the diameter of the electrically resistive via formed is about 1 $\mu$m, and a height is about 100 nm.

The pre-processed substrate for forming the present invention electronic device thereon may be a semiconductor wafer, such as a silicon wafer or an insulating substrate such as one formed by glass, ceramic or a polymer. When a TaSiN alloy is deposited into a film for filling the via openings, the TaSiN film may have a sheet resistance between about 0.3 M-$\Omega$/square and about 1 M-$\Omega$/square, and preferably between about 1 K-$\Omega$/square and about 10 K-$\Omega$/square. The first and the second plurality of conductive elements may be formed of a material selected from doped polysilicon, metal silicide, polycide, refractory metals, aluminum, copper and alloys thereof.

In the preferred embodiment, when one of the first plurality of conductive elements is in electrical communication with two of the plurality of electrically resistive vias, the two vias are normally immediately adjacent to each other.

In an alternate embodiment, the present invention electronic structure can be built such that more than one layer of the plurality of electrically resistive vias are formed. For instance, a second electrically resistive via layer may be formed on top of the second plurality of conductive element layer such that at least one of the second plurality of electrically resistive vias is in electrical communication with at least one of the first plurality of electrically resistive vias. This alternate embodiment provides another benefit that is made possible by the present invention novel structure in that, multiple layers of electrically resistive vias can be constructed such that a resistance of any suitable value can be achieved by connecting a number of vias in-series. The vias may also be connected together in a parallel manner such that a specific resistance can be achieved.

In still another preferred embodiment, the present invention electronic structure with in-situ formed unit resistors may be combined with a capacitor network, such as one that is formed by a deep-trench capacitor or a stacked capacitor. By making a suitable combination of any number of the unit resistors and the capacitors, a desirable circuit can be formed in the semiconductor structure.

The invention further discloses a method for forming a semiconductor structure with in-situ unit resistors by forming a first plurality of conductive elements, then forming a plurality of electrically resistive vias on top of and in electrical communication with the first plurality of conductive elements, and then forming a second plurality of conductive elements in electrical communication and on top of the plurality of electrically resistive vias. The step of forming the electrically resistive vias can be carried out by depositing an electrically resistive metal in via openings by sputtering an alloy target, or by co-sputtering from different metal targets. Either one of the processes can be performed in the presence of nitrogen in order to form an alloy of refractory metal-silicon-nitrogen. The electrically resistive vias may further be formed by depositing an electrically resistive metal into the via openings by an evaporation technique or by a chemical vapor deposition technique.

Referring to FIGS. 1A–1G which illustrate a step-by-step process flow of the present invention method for forming an electronic structure 10 having in-situ unit resistors therein. The method may be started by first depositing on a substrate (not shown) formed of either a semiconductor material such as silicon or an insulating material such as glass, ceramic or a polymer, a layer 12 of a dielectric material such as silicon oxide or silicon nitride. A layer 14 of an electrically conductive material is then blanket deposited on top of the insulating material layer 12. The electrically conductive material may be suitably a material such as doped polysilicon, metal silicide, polycide, refractory metal, aluminum, copper or alloys thereof.

Figure 1B:
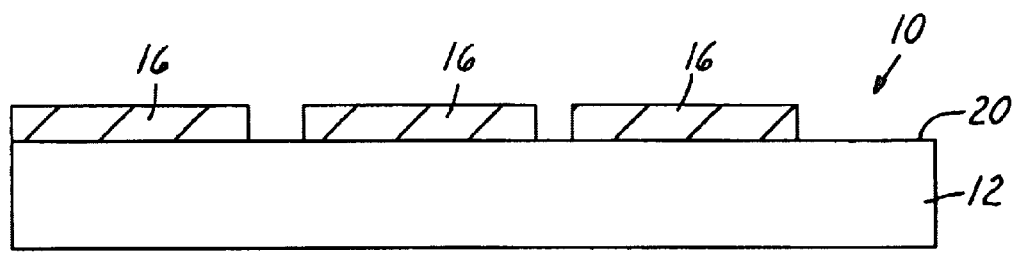
FIG. 1B is an enlarged, cross-sectional view of the present invention electronic structure of FIG. 1A with the first conductive material layer patterned into a first plurality of conductive elements.
Figure 1C:
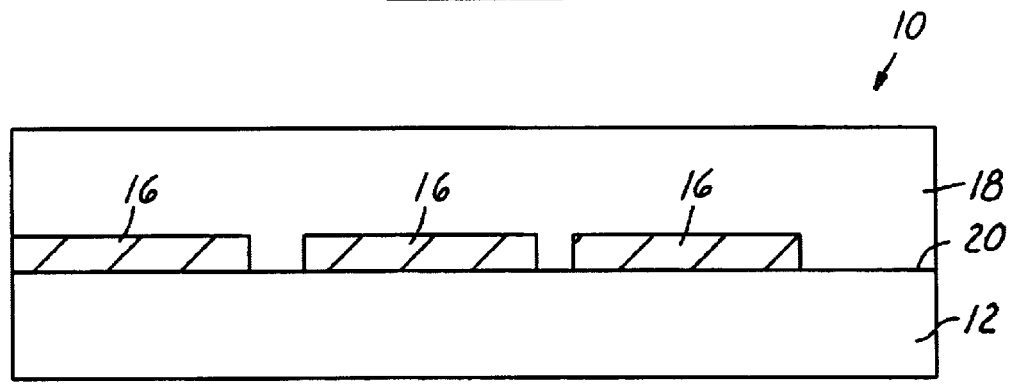
FIG. 1C is an enlarged, cross-sectional view of the present invention electronic structure of FIG. 1B with a second insulating material layer deposited on top.

In the next step of the process, as shown in FIG. 1B, a first plurality of conductive elements 16 is formed from the conductive material layer 14 by standard photolithographic method, including resist coating, exposing with a photomask, pattern developing and a reactive ion etching. It should be noted that the plurality of conductive elements 16 may also be formed by a screen printing or stencil printing technique of a suitable conductive paste material. A second insulating material layer 18 is then blanket deposited on top of the electronic structure 10 by embedding the first plurality of conductive elements 16 and by covering the top surface 20 of the first insulating material layer 12.

Figure 1D:
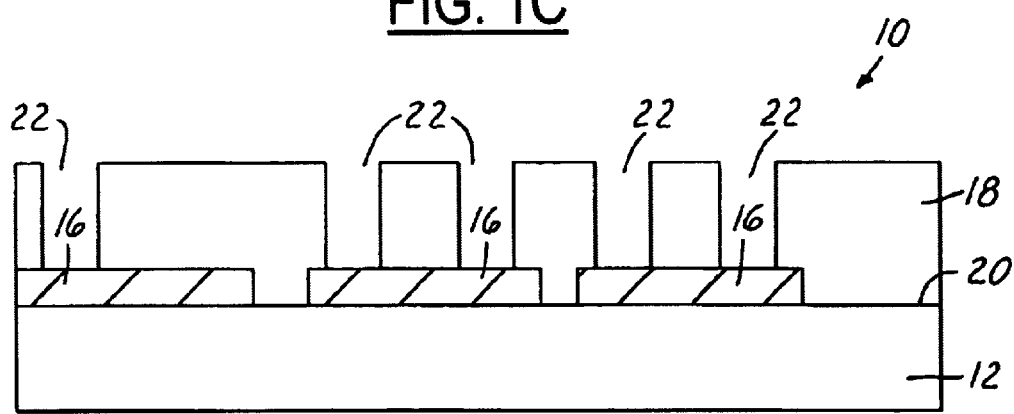
FIG. 1D is an enlarged, cross-sectional view of the present invention electronic structure of FIG. 1C with a plurality of via openings formed in the second insulating material layer.
Figure 1E:
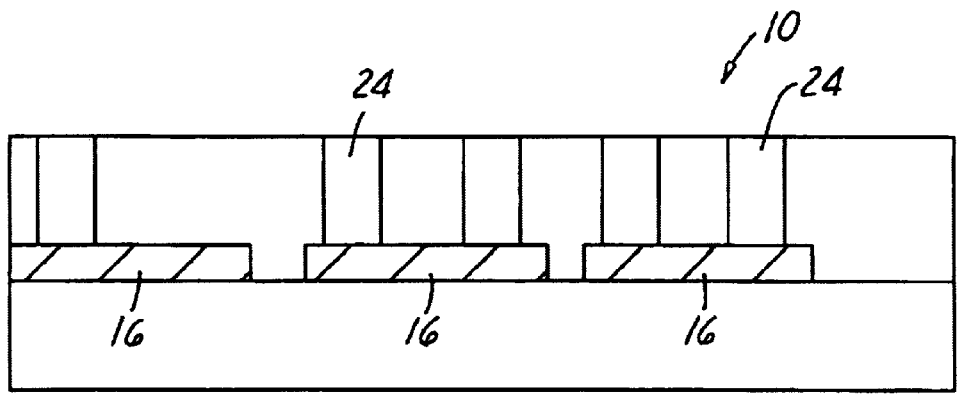
FIG. 1E is an enlarged, cross-sectional view of the present invention electronic structure of FIG. 1D with an electrically resistive material deposited into the plurality of via openings forming a plurality of electrically resistive vias.

In the next step of the process, as shown in FIG. 1D, a photolithographic method is used to form via openings 22 in the second insulating material layer 18. The second insulating material layer 18 may be suitably formed of silicon oxide or silicon nitride. A suitable method for forming the via openings 22 is a reactive ion etching process, for example, using a $CF_4$ plasma. An electrically resistive metallic material 24 is then deposited on top of the electronic structure 10 for filling the via openings 22 and for covering the top of the structure 10. After excess metal on top of structure 10 is removed, as shown in FIG. 1E, a plurality of electrically resistive vias 24 is left in the via openings 22. At the end of the formation process, excess electrically resistive material can be removed by a method such as chemical mechanical polishing prior to the deposition of the second conductive material layer 28.

A suitable material for the electrically resistive metal is a metal or an alloy that has a resistivity of at least 1100 Ω-cm, and preferably at least 150 Ω-cm. For instance, one of such material is a refractory metal-silicon-nitrogen wherein the refractory metal may be selected from the group consisting of Ta, Nb, V, W and Ti. When a material such as Ta—Si—N is utilized, the material may consist of between about 10 at. % and about 55 at. % Ta, between about 10 at. % and about 45 at. % Si, and between about 30 at. % and about 80 at. % N. A suitable dimension for the electrically resistive vias 24 formed may be a diameter between about 0.1 μm and about 100 μm, and a height between about 10 nm and about 1,000 nm.

It has been found that the sheet resistance of TaSiN for forming the present invention electrically resistive vias is between about 0.3 M-Ω/square and about 1 K-≠/square with a reasonable uniformity control while a more preferred range for the sheet resistance is between about 1 K-Ω/square and about 10 KΩ/square. A typical electrically resistive via in the present invention preferred embodiment has a dimension of about 1 μm in diameter and about 100 nm in height.

Figure 1F:
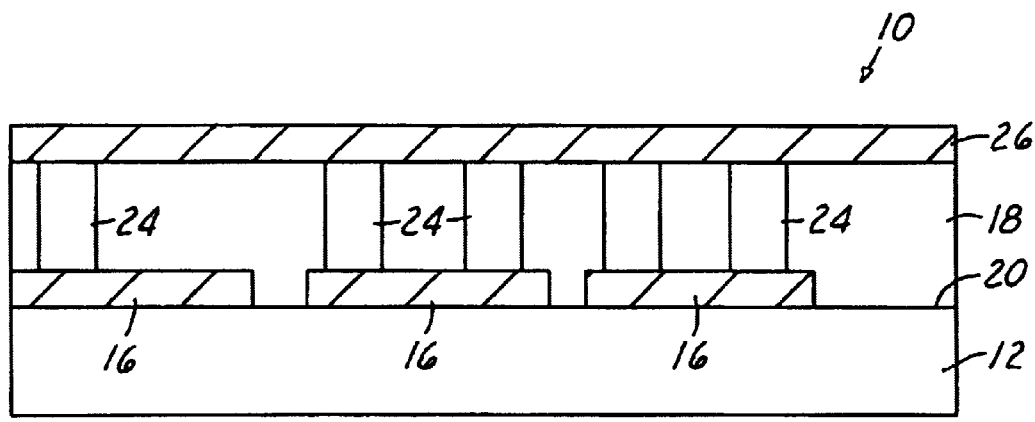
FIG. 1F is an enlarged, cross-sectional view of the present invention electronic structure of FIG. 1E with a second electrically conductive layer deposited on top of the plurality of electrically resistive vias.

FIG. 1F shows the next step of the process in which a second conductive material layer 26 is deposited on top of and in electrical communication with the plurality of electrically resistive vias 24 and on top of the second insulating material layer 18. The second conductive material layer may be deposited of the same or a different conductive material selected from doped polysilicon, metal silicide, polycide, refractory metal, aluminum, copper or alloys thereof.

Figure 1G:
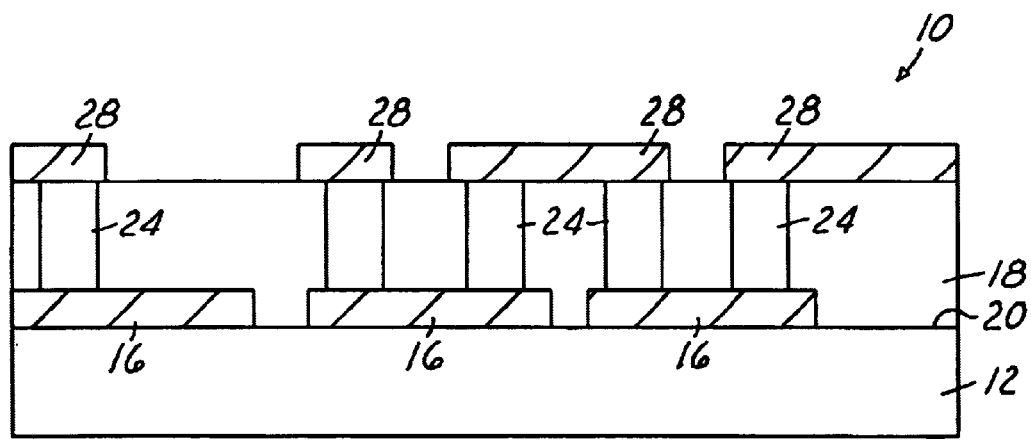
FIG. 1G is an enlarged, cross-sectional view of the present invention electronic structure of FIG. 1F with the second layer of electrically conductive material patterned into a second plurality of conductive elements each in electrical communication with at least one of the plurality of electrically resistive vias.

To complete the present invention electronic structure, the second conductive material layer 26 is formed into a second plurality of conductive elements 28, as shown in FIG. 1G. The formation process for the second plurality of conductive elements 28 may be similar to that used in forming the first plurality of conductive elements 16, i.e. by a standard photolithographic and etching method. It is also possible that the second plurality of conductive elements 28 may be deposited and formed in a single step by screen printing or stencil printing a conductive paste material. The approach provides the additional benefit that a two-step deposition/forming process can be reduced to a single step forming process.

Figure 2A:
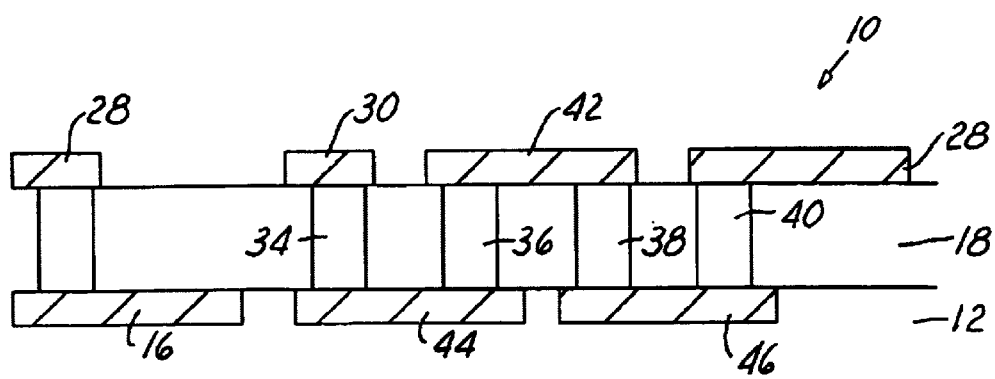
FIG. 2A is an enlarged, cross-sectional view of the present invention electronic structure similar to that shown in FIG. 1G but the first conductive material layer is formed inside an insulating substrate.
Figure 2B:
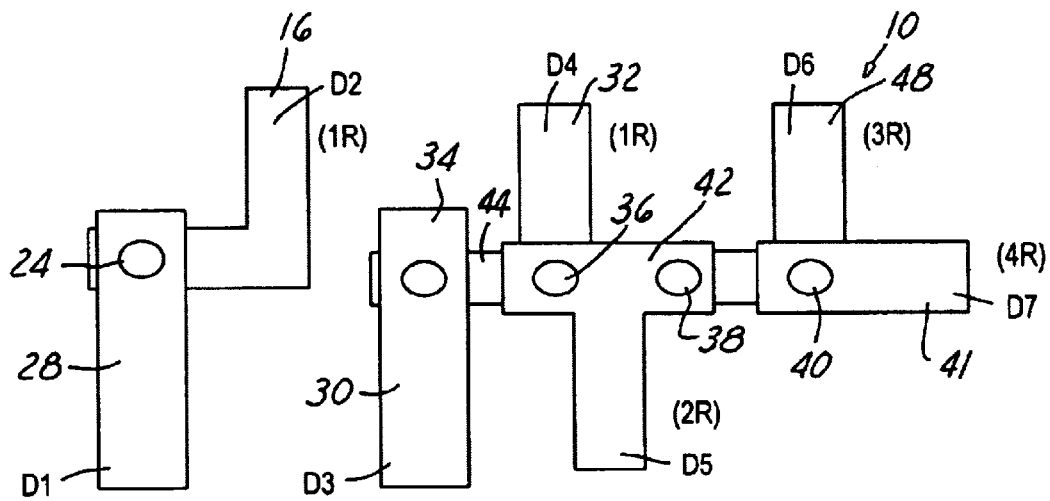
FIG. 2B is a plane view of the present invention electronic structure of FIG. 2A.

FIG. 2A illustrates an enlarged, cross-sectional view of a present invention structure 10 similar to that of FIG. 1G, but on an insulating layer 12. A plane view of the electronic structure 10 is shown in FIG. 2B. The versatility of the present invention process for forming electronic structures with in-situ formed unit resistors 24 is thus shown in FIGS. 2A and 2B. For instance, to form a unit resistor that has a single resistance value of 1R, the structure shown on the left side of FIG. 2B can be utilized which includes a conductive element 28 with node D1 electrically connected to a single electrically resistive via 24 and a conductive element 16 with a node D2. The circuit shown on the right side of FIG. 2B indicates that a resistance value of 2R can be obtained between the conductive element 30 with anode D3 and the conductive element 42 by flowing an electrical current through via 34 to metal 32, and from metal 32 via 36 to metal 42 which has two resistive vias connected in-series. Via 34 and via 36 are connected in-series by conductive element 44. The resistance value obtained between the conductive element 30 and the conductive element 42 or to node D5 therefore doubles that obtained between the conductive element 28 and the conductive element 16. Similarly, by connecting via 36 and via 38 in-series by the conductive element 42, and then connecting via 38 to metal 48 or node D6 to have an electrical resistance of 3R. Furthermore, metal 30 or from node D3 through vias 34,36, 38 and 40 in-series by the conductive element 46, or node D7, an electrical resistance of 4R may be obtained between the conductive element 30 and the conductive element 46. A versatile electrically resistive via network can thus be obtained for any suitable value of electrical resistance by utilizing the present invention novel method.

Figure 3:
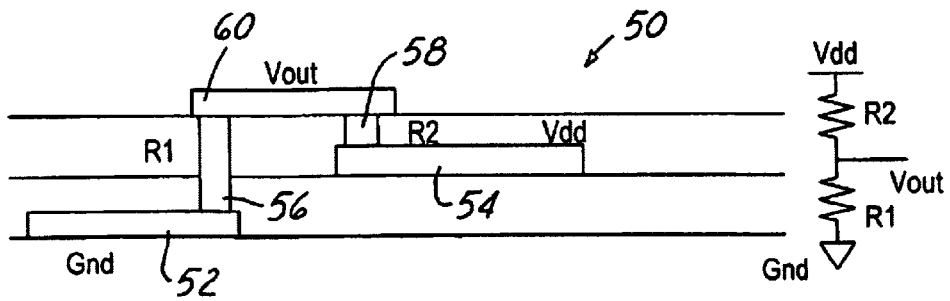
FIG. 3 is an enlarged, cross-sectional view of the present invention electronic structure wherein a first metal via is connected to a ground bus, and a second metal via is connected to a power supply, or $V_{dd}$.

One implementation example of the present invention electronic structure 50 is shown in FIG. 3 wherein a first conductive element 52 is connected to a ground bus, while a second conductive element 54 is connected to a power supply, or $V_{dd}$. By forming the electrically resistive vias 56,58 in different heights, different resistance value of $R_1$ and $R_2$ may be obtained. The two unit resistors 56,58 are connected in-series by a third conductive element 60 as $V_{out}$. When the third conductive element 60 connects between the first conductive element 52 and the second conductive element 54, i.e. functions as the $V_{out}$ node, a voltage divider is formed. It should be noted that both via 56 and via 58 can be formed of any desirable resistance value via size, number of elements connected in parallel or in serial.

Figure 3A:
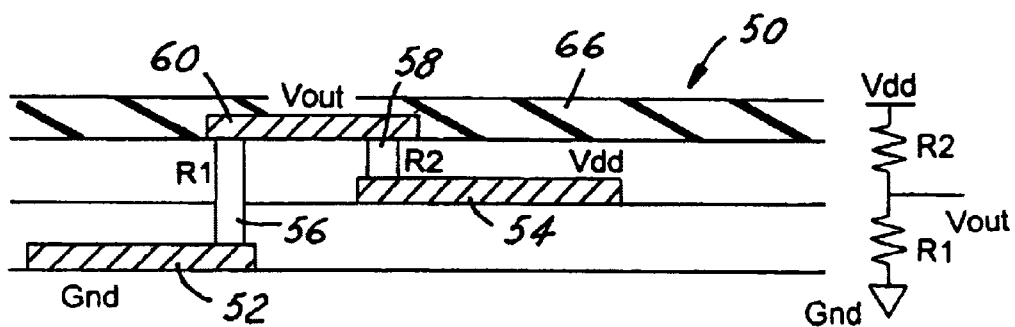
FIG. 3A is an enlarged, cross-sectional view of another embodiment of the present invention electronic structure having a third insulating layer deposited on top.

In another embodiment of the present invention, more than one level of the electrically resistive vias may be formed and connected to each other. For instance, as shown in FIG. 3A, a third insulating material layer 66 may be deposited overlying the second plurality of conductive elements and the second insulating material layer; and then a second plurality of electrically resistive vias that have a resistivity of at least 100 Ω-cm may be formed in the third insulating material layer wherein each of the second plurality of conductive elements is in electrical communication with at least one of the second plurality of electrically resistive vias; and a third plurality of conductive elements is then formed on top of the third insulating material layer each in electrical communication with at least one of the second plurality of electrically resistive vias, whereby at least one of the second plurality of electrically resistive vias is in electrical communication with at least one of the first plurality of electrically resistive vias.

Figure 4:
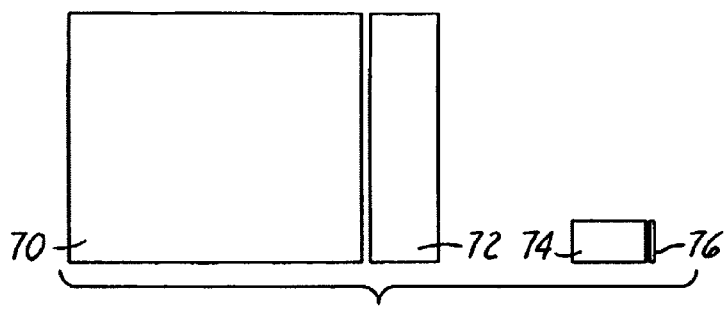
FIG. 4 is a comparison between chip real estate taken up by a conventional plate capacitor/diffusion resistor and a present invention deep-trench capacitor/high density resistor.

In an alternate embodiment, the present invention unit resistors, or high-density unit resistors since they can be formed with small pitch distance in-between as limited only by the photolithographic method, may further be combined with a capacitor network to form desirable RC circuits. For instance, a suitable capacitor system may be a deep-trench capacitor or a stacked capacitor. The embodiment significantly reduces the area required for a RC circuit especially with large R and C values. An example illustrating the area reduction is shown in FIG. 4. Utilizing presently available fabrication technology, a capacitance value for a plate capacitor of about 5 fF/μm square, and a similar value for a deep-trench capacitor of about 230 fF/μm square may be obtained. The area saving can be calculated to be about 45×, as illustrated in FIG. 4. It should be noted that the diagrams are not proportional. When a deep-trench capacitor is used in combination with the present invention vertically positioned unit resistors, the area saving is even more significant. An area comparison between a conventional diffusion resistor 72 and a present invention high-density vertical resistor 76 is also shown in FIG. 4.

Figure 5:
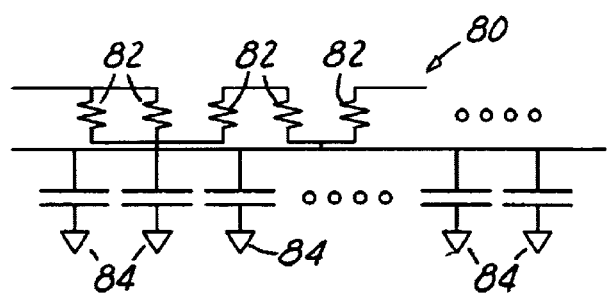
FIG. 5 is a circuit diagram illustrating another embodiment of the present invention device wherein unit resistors are stacked on top of a deep-trench capacitor.

A schematic of a sample RC circuit 80 utilizing the present invention high-density unit resistors 82 stacked on top of deep-trench capacitors 74 are shown in FIG. 5.

A circuit schematic indicating that any desirable number of deep-trench capacitor 84, similar to those being used in a DRAM array, can be formed in parallel to achieve a relatively large capacitor size within a small area. For example, using the state-of-the-art deep-trench capacitor DRAM cell, with 0.18 µm ground rule, one can obtain a 1 nf capacitor with a size of about 5,000 µm².

On top of the capacitor array, one can build high-density resistor arrays. These resistor elements 82 inside the resistor array can be connected in parallel or in serial in order to result in a desirable resistance value.

For certain application, RC components are used to build filter, heater, delay chain, etc. Or they can also be used as elements for an analog circuit application.

An enlarged, cross-sectional view of an electronic structure 90 formed by a deep-trench capacitor 92 as used in a DRAM chip is shown in FIG. 6. The present invention novel method enables a simple integration of high-density unit resistors 96 with the deep-trench capacitors 92.

Figure 6B:
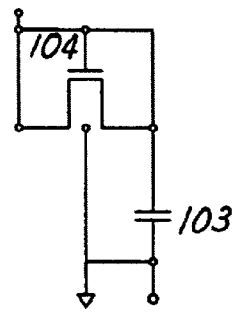
FIG. 6B is a circuit schematic of the deep-trench capacitor of FIG. 6A.

An enlarged cross-sectional view of a deep-trench capacitor array to be used for a high value capacitor. In this array, the dynamic random access memory (or DRAM) cell comprises of a deep-trench capacitor 103 and a transfer device 104 as shown in FIG. 6B. One node of all the deep-trench capacitor in the array is connected to the plate, the other node is connected to the drain of the transfer device 104. In order to disable this transfer device, the gate 98 and source/drain 99A and 99B, are all tied together to a node called DTCAP. All the trench capacitors have a collar region 97 to avoid a parasitic vertical device. The collars are formed with a thicker oxide in the range of 200 Å thick. The node dielectric of the trench capacitor 95 is a thin thermal oxide with another thin layer of CVD nitride. The depth of the deep trench is about 10 µm. The trenches are formed in a buried n-well 92. Inside of the trenches are filled with doped (mostly n-type doped) polysilicon 96. The out diffusion of the n-type doped polysilicon from the top of the trench joins the device drain nt implant region. The CB contact (or contact for bit-line) 99 is originally used for bit-line to contact to the source of the transfer device, but now is used to shorten the gate, source, drain of the transfer device so as to form a DTCAP node.

Figure 6A:
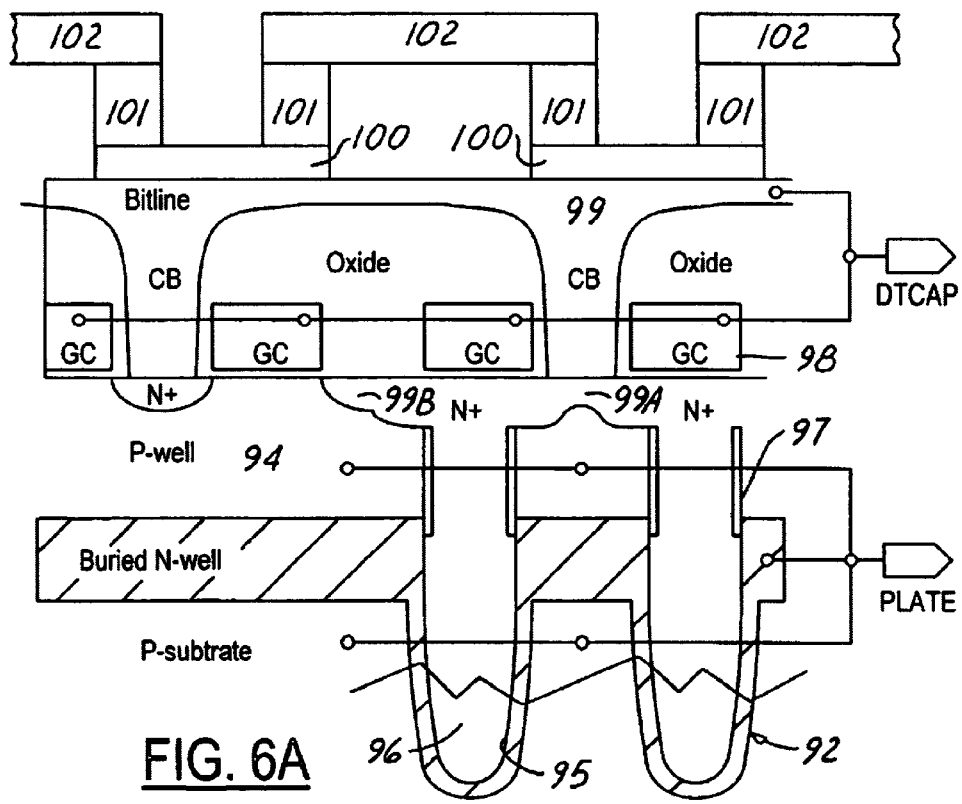
FIG. 6A is an enlarged, cross-sectional view of a deep-trench capacitor in a DRAM device with the present invention high-density unit resistors connected on top (not shown).

As shown in FIG. 6A, all the trench capacitors inside the array are now connected in parallel. That is, all the DTCAP nodes are connected together, and all the plate nodes are connected together. For example, if each cell has a capacitor value of 40 fF with a size of 0.20 µm², then in order to form a large capacitor of 1 nF an array of 25K cells is needed. Total area is 45× smaller than a planar capacitor. To form a high-R resistor element on top of the deep-trench array, the steps shown in FIG. 1A to FIG. 1G can be followed. A first metal 100 (optional) and plurality of resistive via 101 and second metal 102 to join the resistor element in parallel/serial together with the capacitor element. In practice the capacitor can be formed without transfer gate. For process simplicity, or forming large capacitor and array device simultaneously, the transfer gate is inevitable as long as it can be disabled.

The present invention novel electronic structure that has in-situ formed unit resistors and a method for forming the structure, and in addition, a method for forming multi-level unit resistors and structures combining unit resistors with a capacitor network have therefore been amply described in the above description and in the appended drawings of FIGS. 1A–6.

While the present invention has been described in an illustrative manner, it should be understood that the terminology used is intended to be in a nature of words of description rather than of limitation.

Furthermore, while the present invention has been described in terms of a preferred and two alternate embodiments, it is to be apperciated that those skilled in the art will readily apply these teachings to other possible variations of the invention.

The embodiment of the invention in which an exclusive property or privilege is claimed are defined as follows:

What is claimed is:

1. An electronic structure having in-situ formed unit resistors comprising:
    a pre-processed substrate having a first insulating material layer on top;
    a first plurality of conductive elements formed on said first insulating material layer;
    a second insulating material layer overlying said first plurality of conductive elements and said first insulating material layer;
    a plurality of electrically resistive vias having a resistivity of at least 100 Ω-cm formed in said second insulating material layer wherein each of said first plurality of conductive elements in electrical communication with at least one of said plurality of electrically resistive vias; and
    a second plurality of conductive elements formed on top of said second insulating material layer each in electrical communication with at least one of said plurality of electrically resistive vias.

2. An electronic structure having in-situ formed unit resistors according to claim 1, wherein said pre-procesaed substrate is a semiconductor wafer.

3. An electronic structure having in-situ formed unit resistors according to claim 1, wherein said pre-processed substrate is formed of an electrically insulating material selected from the group consisting of glass, ceramic and polymeric materials.

4. An electronic structure having in-situ formed unit resistors according to claim 1, wherein said plurality of electrically resistive vias are formed of a refractory metal-silicon-nitrogen material.

5. An electronic structure having in-situ formed unit resistors according to claim 1, wherein said plurality of electrically resistive vias are formed of a refractory metal-silicon-nitrogen material wherein the refractory metal is selected from the group consisting of Ta, Nb, V, W and Ti.

6. An electronic structure having in-situ formed unit resistors according to claim 1, wherein said plurality of electrically resistive vias are formed of TaSiN having a composition of between about 10 at. % and about 55 at. % Ta, between about 10 at. % and about 45 at. % Si, and between about 30 at, % and about 80 at. % N.

7. An electronic structure having in-situ formed unit resistors according to claim 1, wherein said plurality of electrically resistive vias each has a diameter between about 0.1 µm and about 100 µm, and a height between about 10 nm and about 1,000 nm.

8. An electronic structure having in-situ formed unit resistors according to claim 1, wherein said plurality of electrically resistive vias having a resistivity preferably of at least 150 Ω-cm.

9. An electronic structure having in-situ formed unit resistors according to claim 1, wherein said plurality of electrically resistive vias are formed by depositing a TaSiN film layer into a plurality of via openings, wherein said TaSiN film layer having a sheet resistance between about 0.3 M-Ω/square and about 1 M-Ω/square.

10. An electronic structure having in-situ formed unit resistors according to claim 9, wherein said sheet resistance is preferably between about 1 K-Ω/square and about 10 K-Ω/square.

11. An electronic structure having in-situ formed unit resistors according to claim 1, wherein said plurality of electrically resistive vias having a diameter preferably of about 1 µm, and a height preferably of about 100 nm.

12. An electronic structure having in-situ formed unit resistors according to claim 1, wherein said first plurality of conductive elements and said second plurality of conductive elements are formed of a material selected from the group consisting of doped polysilicon, metal silicide, polycide, refractory metals, aluminum, copper, and alloys thereof.

13. An electronic structure having in-situ formed unit resistors according to claim 1, wherein each of said first plurality of conductive elements is in electrical communication with two of said plurality of electrically resistive vias that are immediately adjacent to each other.

14. An electronic structure having in-situ formed unit resistors according to claim 1, wherein each of said second plurality of conductive elements is in electrical communication with two of said plurality of electrically resistive vias that are immediately adjacent to each other.

15. An electronic structure having in-situ formed unit resistors according to claim 1 further comprising:

a third insulating material layer overlying said second plurality of conductive elements and said second insulating material layer;

a second plurality of electrically resistive vias having a resistivity of at least 100 Ω-cm formed in said third insulating material layer wherein each of said second plurality of conductive elements in electrical communication with at least one of said second plurality of electrically resistive vias; and a third plurality of conductive elements formed on top of said third insulating material layer each in electrical communication with at least one of said second plurality of electrically resistive vias;

whereby at least one of said second plurality of electrically resistive vias is in electrical communication with at least one of said first plurality of electrically resistive vias.

* * * * *